US007614021B1

(12) United States Patent
Allen (10) Patent No.: US 7,614,021 B1
(45) Date of Patent: Nov. 3, 2009

(54) OPTIMAL AMPLIFIER PERFORMANCE SELECTION METHOD

(75) Inventor: Jeffery C. Allen, San Diego, CA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 374 days.

(21) Appl. No.: 11/752,034

(22) Filed: May 22, 2007

(51) Int. Cl.
*G06F 17/50* (2006.01)
(52) U.S. Cl. .................................... 716/1; 716/4
(58) Field of Classification Search .................. 716/1, 716/4; 455/106, 139; 330/261, 276, 277, 330/285, 290; 326/33, 34, 82
See application file for complete search history.

(56) References Cited

U.S. PATENT DOCUMENTS

| 3,909,602 | A  | * | 9/1975 | Micka | 716/4 |
|---|---|---|---|---|---|
| 2005/0105644 | A1 | * | 5/2005 | Baxter et al. | 375/316 |
| 2006/0087376 | A1 | * | 4/2006 | Young et al. | 330/286 |
| 2007/0001765 | A1 | * | 1/2007 | Fujii | 330/276 |
| 2007/0004344 | A1 | * | 1/2007 | DeGroot et al. | 455/78 |

OTHER PUBLICATIONS

Paganelli, R et al., "A Computationally Efficient Approach for the Design of RF Amplifiers" Proceedings of 32nd European Microwave Conference 2002, Oct. 2002, pp. 1- 4.*
Babak, L.I., "A New Approach to Synthesis of Matching Networks and Equalizers for RF and Microwave Solid-State Circuits", Proceeedings of 1997 Symposium on Circuits and Systems, 1997, ISCAS '97, Jun. 1997, pp. 353-356.*
Zhu, Lizhong; Boxiu, Wu; Chuyu, Sheng: "Real Frequency Technique Applied to the Synthesis of Lumped Broad-Band Matching Networks with Arbitrary Nonuniform Losses for MMIC's," IEEE Transactions on Microwave Theory and Techniques, vol. 36, No. 12, pp. 1614-1620, 1988.
Jung, Wen-Lin; Jingshown, Wu: "Stable Broad-Band Microwave Amplifier Design, IEEE Transactions on Microwave Theory and Techniques," vol. 38, No. 8, pp. 1079-1085, 1990.

* cited by examiner

*Primary Examiner*—Stacy A Whitmore
*Assistant Examiner*—Magid Y Dimyan
(74) *Attorney, Agent, or Firm*—Ryan J. Friedl; Kyle Eppele (57) ABSTRACT

A method of determining an amplifier performance is provided. One embodiment establishes a number of amplifier performance constraints. A search is then conducted for an input and an output disk that satisfy the amplifier performance constraints. A vector index is then generated that includes a load reflectance $S_L$ and a generator reflectance $S_G$ at a number of different radio frequencies. The amplifier performance constraints are then input into the vector index and the load reflectances $S_L$ and generator reflectances $S_G$ that meet the amplifier performance constraints are determined.

16 Claims, 9 Drawing Sheets

OPTIMAL AMPLIFIER PERFORMANCE SELECTION METHOD

FEDERALLY-SPONSORED RESEARCH AND DEVELOPMENT

This invention (Navy Case No. 84539) was developed with funds from the United States Department of the Navy. Licensing inquiries may be directed to Office of Research and Technical Applications, Space and Naval Warfare Systems Center, San Diego, Code 2112, San Diego, Calif. 92152; telephone (619) 553-2778; email: T2@spawar.navy.mil.

COMPUTER PROGRAM LISTING APPENDIX

A computer program listing appendix accompanies this application in the form of an electronically uploaded text file entitled "084539_cpl," created May 21, 2007, having a size of 21 kilobytes. The 084539_cpl document is incorporated herein by reference in its entirety.

BACKGROUND

The present invention generally relates to methods for selecting a physically attainable amplifier performance. More specifically, but without limitation thereto, the present invention relates to a method, system, and computer program to determine if a user-specified amplifier performance is attainable by cascading a given wideband amplifier with input and output matching circuits.

The amplification of a weak, noisy, wideband signal is a fundamental problem in electrical engineering. The amplifier increases the power of weak signal but also amplifies the input noise and adds its own "self noise." Anyone fiddling with a car radio soon learns turning up the volume of a noisy signal merely makes a loud, noisy signal. In addition, the optimal amplifier should also be stable. The characteristic high-frequency "howl" of public address systems is an example of instability.

The amplifier designer typically selects a circuit topology, selects the reactive elements, constrains the reactive element values, and then attempts to optimize the element values. The difficulty of this approach is that there are many circuit topologies. This forces the amplifier designer to undertake a massive search to determine an optimal network topology.

To address this problem, the electrical engineering community has developed many amplifier matching programs. Some are kept current with on-line updates of the latest data from amplifier manufactures. Some programs include the effects of the biasing circuitry on the specified transistor operational points and the packaging parasitics. These programs compute the amplifier's performance for a specific device and topology.

However, there still remains a need to provide a better method to determine an optimal amplifier.

SUMMARY OF SOME EMBODIMENTS

One embodiment of an amplifier selection method and algorithm as described herein is directed to overcoming the problems described above, and may provide further related advantages.

For example, one embodiment provides a method of determining an optimal amplifier based on a number of amplifier performance constraints which are input into a computer program. A search is then conducted for an input and an output disk that satisfy the amplifier performance constraints. A vector index is then generated that includes a load reflectance $S_L$ and a generator reflectance $S_G$ at a number of different radio frequencies. The amplifier performance constraints are then input into the vector index and the load reflectances $S_L$ and generator reflectances $S_G$ that meet the amplifier performance constraints are determined.

One advantage of the amplifier selection method and algorithm described herein is that the massive search required to determine an optimal network topology is eliminated, saving the amplifier designer a tremendous amount of time and effort.

A computer program listing appendix accompanies this application and includes a text file entitled "084539_cpl" that comprises a MATLAB computer program that is one embodiment of an amplifier selection method and algorithm described herein.

These and other capabilities and advantages will be appreciated from review of the following Detailed Description of the Embodiments, along with the accompanying figures in which like reference numerals are used to describe the same, similar or corresponding parts in the several views of the drawings.

It will be recognized that some or all of the Figures are schematic representations for purposes of illustration and do not necessarily depict the actual relative sizes or locations of the elements shown. The Figures are provided for the purpose of illustrating one or more embodiments with the explicit understanding that they will not be used to limit the scope or the meaning of the claims.

DETAILED DESCRIPTION OF SOME EMBODIMENTS

In the following paragraphs, an amplifier selection method and algorithm will be described in detail by way of example with reference to the attached drawings. While the amplifier selection method is capable of embodiment in many different forms, there is shown in the drawings and will herein be described in detail specific embodiments, with the understanding that the present disclosure is to be considered as an example of the principles of the amplifier selection method and not intended to limit the amplifier selection method to the specific embodiments shown and described. That is, throughout this description, the embodiments and examples shown should be considered as exemplars, rather than as limitations on the amplifier selection method.

The amplifier selection method described herein allows the amplifier designer to determine an amplifier's best performance attainable over all possible matching circuits. Knowing the tradeoff between the best possible gain, the least noise, and the largest stability margin prevents the amplifier designer from a fruitless search when the design constraints are physically unachievable.

Generally, an amplifier is an electronic device used to boost the power, voltage or current of an electronic signal. For example, a guitar amplifier boosts the signal from a pickup or microphone. Put differently, an amplifier is generally used to increase the gain of a signal. In electronics, gain is usually understood as the ratio of a signal output to a signal input. For example, a gain of 10 would imply that a property of the signal (usually voltage or power) had increased by a factor of 10. The amount of gain is usually expressed in decibels above a reference level. Often, when an amplifier increases the gain of a signal, it also may increase the noise in the signal. Noise is the unwanted portion of a signal such as hiss, hum, whine, static, or buzzing. That is, noise is any unwanted or unmodulated energy that is present to some extent within a signal. Increasing gain and decreasing noise are the primary considerations when designing, or choosing an amplifier.

Another factor that may be considered is stability. Generally, stability is the ability of a device or sensor to maintain a consistent output when a constant input is applied. Put differently, it is the ability of a component, circuit, or system to maintain a fixed level of operation within specified tolerances under varying external conditions. Changing conditions may include voltage, frequency, temperature, and longevity.

Usually, an amplifier designer typically selects a circuit topology (which is the electrical configuration or arrangement of the circuit), selects the reactive elements, constrains the reactive element values, and then attempts to optimize the element values. The difficulty of this approach is that there are many circuit topologies. This forces the amplifier designer to undertake a massive search to determine an optimal network topology.

In contrast, the amplifier selection method described herein estimates the best possible amplifier performance attainable by any lossless input and output 2-port circuit. It is known that the electrical engineering community has developed many amplifier matching programs. Some are quite detailed and are kept current with on-line updates of the latest data from the manufactures. Others include the non-trivial effects of the biasing circuitry on the specified transistor operational points and the packaging parasitics.

Generally, these programs compute an amplifier's performance for a specific device and topology. As such, these programs do not admit a comparison with the amplifier selection method described herein. In contrast to conventional amplifier design methodologies, the amplifier selection method described herein lets the amplifier designer place a circuit-specific computation in the more general context of the best performance available from any lossless matching 2-port circuit.

The amplifier selection method described herein allows an amplifier designer to search over collections of input and output matching 2-ports to find an acceptable tradeoff between the amplifier functions of gain, noise and stability (e.g., accepting a smaller gain to get less noise and better stability).

Figure 1:
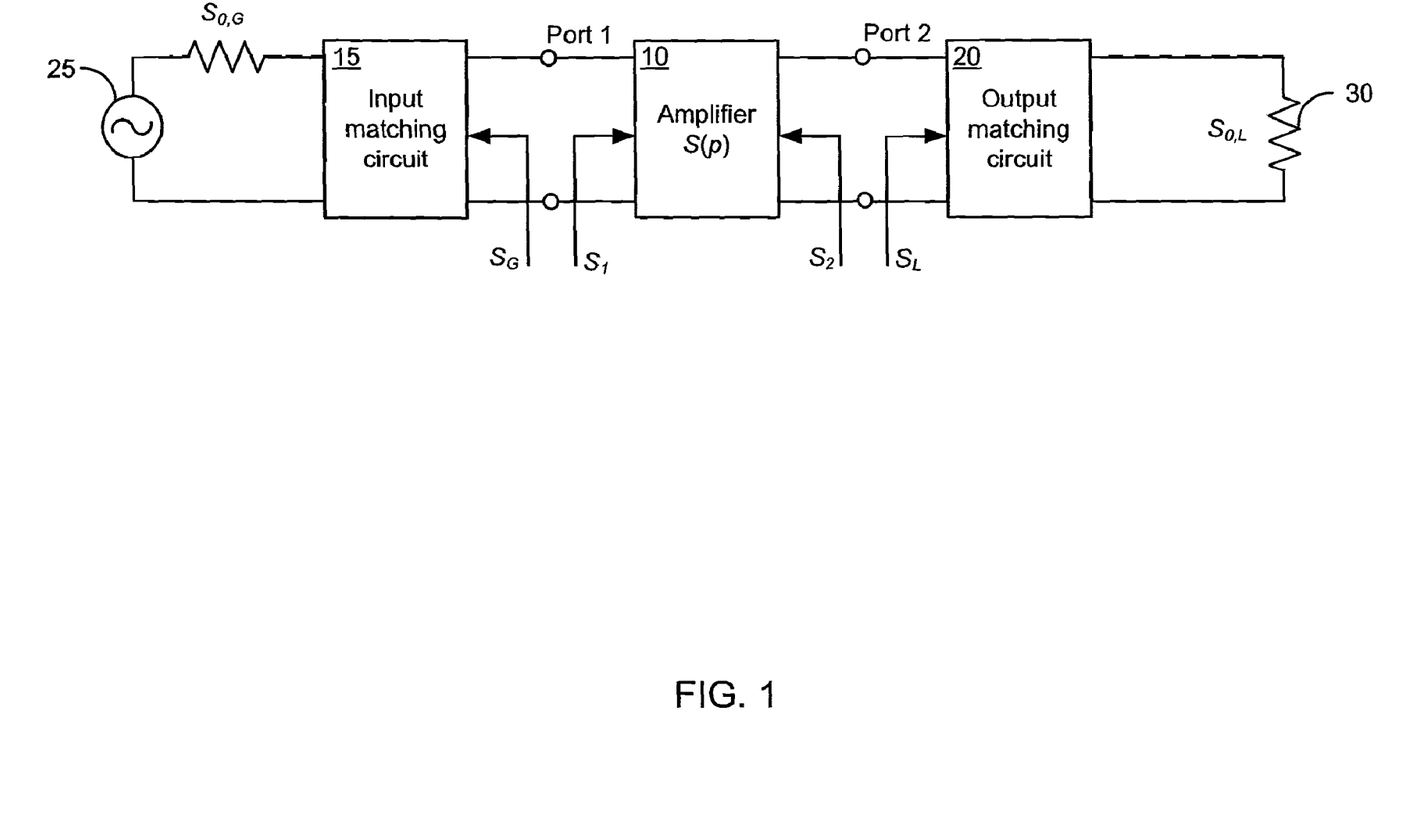
FIG. 1 is an illustration of an exemplary amplifier coupled to an input matching circuit and an output matching circuit.

Referring now to FIG. 1, both the amplifier 10 and the input matching circuit 15 as well as the output matching circuit 20 are modeled as "2-ports." A 2-port is a "black box" with 2 pairs of wires sticking out of it. The use of the word "port" means that each pair of wires obeys a conservation of current: the current flowing into one wire of the pair equals the current flowing out of the other wire. FIG. 1, as well as FIGS. 2-7, and the following detailed description may contain symbols that are described in the following Table 1:

TABLE 1

| | |
|---|---|
| R | Real numbers |
| C | Complex numbers |
| $C_+$ | Open right half plane |
| jR | Imaginary axis: $j = +\sqrt{-1}$ |
| p | Complex frequency: $p = \sigma + j\omega$ |
| $\omega$ | Radial frequency (radians per second) |
| f | Frequency (Hertz): $\omega = 2\pi f$ |
| S | Scattering matrix |
| $S_1, S_2$ | Input $S_1$ and output $S_2$ reflectances |
| $S_G, S_L$ | Generator $S_G$ and load $S_L$ reflectances |
| $G_T$ | Transducer power gain |
| F | Noise Figure |
| $L^\infty(jR)$ | Essentially bounded functions on the imaginary axis |
| $H^\infty(C_+)$ | Hardy space on the open right half plane |
| $\overline{D}(C, R)$ | Closed disk with center C and radius R: $\|\phi - C\| \leq R$ |
| Ø | Empty set |
| $\in$ | Set membership |
| $S^H$ | Conjugate transpose of matrix S |
| $a^H$ | Conjugate transpose of vector a |
| := | Defines |

FIG. 1 shows the amplifier 10 connected to the input matching circuit 15 and output matching circuit 20, of which both are 2-ports. The input matching circuit 15 2-port connects the signal generator 25 to Port 1 of the amplifier. The output matching circuit 20 2-port connects Port 2 of the amplifier 10 to a load 30. The amplifier 10 has a scattering matrix S as defined below in Equation 1:

$$S = \begin{bmatrix} S_{11} & S_{12} \\ S_{21} & S_{22} \end{bmatrix} \qquad \text{Equation 1}$$

As shown in FIG. 1, $S_G$ denotes the reflectance of the input matching circuit 15 terminated in the generators' reflectance $S_{0,G}$. $S_L$ denotes the reflectance of the output matching circuit 20 terminated in the load's reflectance $S_{0,L}$. $S_1$ denotes the reflectance looking into Port 1 of the amplifier 10 with Port 2 terminated in $S_L$. $S_2$ denotes the reflectance looking into Port 2 of the amplifier 10 with Port 1 terminated in $S_G$.

Generally, reflectance is the ratio of power reflected to the incident power at a connector junction or other component or device, usually measured in decibels (dB). Reflectance is stated as a negative value, eg −30 dB. A connector that has a better reflectance performance would be a −40 dB connector or a value less than −30 dB. Thus, the input reflectance $S_G$ and the output reflectance $S_L$ determine the gains at each frequency $\omega$. Also, the input reflectance $S_G$ determines the noise figure at each frequency $\omega$, and the input and output reflectances $S_G$ and $S_L$ also determine stability at each frequency $\omega$.

The amplifier selection method and algorithm described herein selects lossless input matching circuit 15 and output matching circuit 20 2-ports that simultaneously maximize the transducer power gain, minimize the noise figure, and ensure maximal stability. The matching is equivalent to finding $S_G$ and $S_L$ that meet the gain, noise, and stability constraints at each frequency $\omega$.

Just because the amplifier designer wants a huge gain does not mean the amplifier and the matching circuits can physically supply this gain. The amplifier selection method described herein tests if the gain, noise, and stability constraints are feasible using two approaches: 1) geometric: any $S_G$ and $S_L$ that meet the constraints as defined by a generally circular disk; and 2) analytic: any analytic $S_G$ and $S_L$ that meet the constraints as defined by an analytic approach. If the constraints are feasible, matching circuits exist that can meet the design and the amplifier designer can undertake a non-empty search. If the constraints are not feasible, no matching circuits can meet the design. The amplifier designer must reduce gain, increase noise, or decrease stability to get physically realizable constraints.

One embodiment of the amplifier selection method as described herein is embodied in an algorithm that computes the amplifier over all lumped, lossless input 2-ports and lossless output 2-ports. One version of the algorithm is embodied in a MATLAB computer program (a data-manipulation software package manufactured by The Mathworks Company of Natick, Mass.) accompanying this application as a computer program listing appendix, the program electronically uploaded as a text file entitled "084539_cpl."

Figure 2:
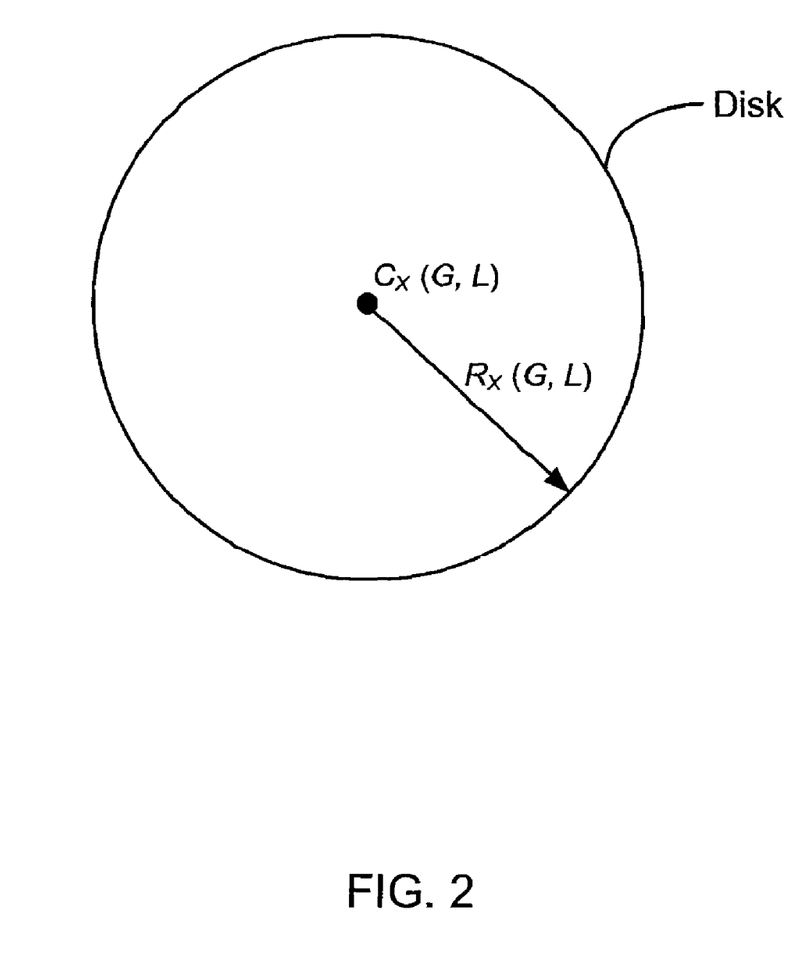
FIG. 2 is an illustration of a disk as output by one embodiment of the amplifier selection method and algorithm described herein.
Figure 3:
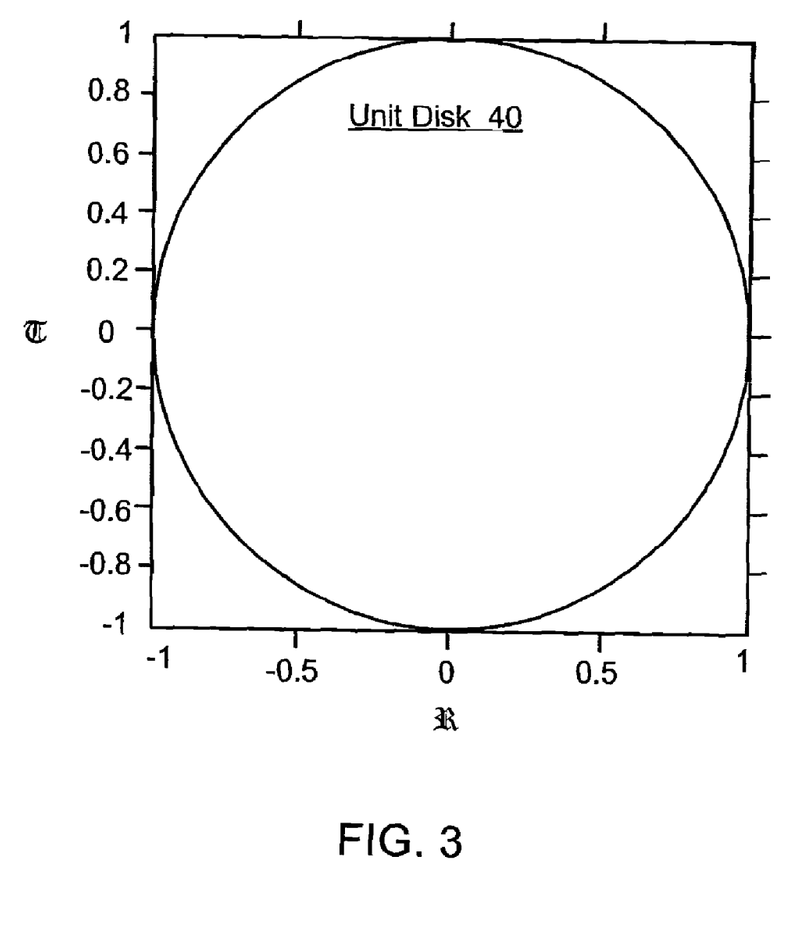
FIG. 3 is an illustration of a unit disk and a reflectance disk as output by one embodiment of the amplifier selection method and algorithm described herein.
Figure 4:
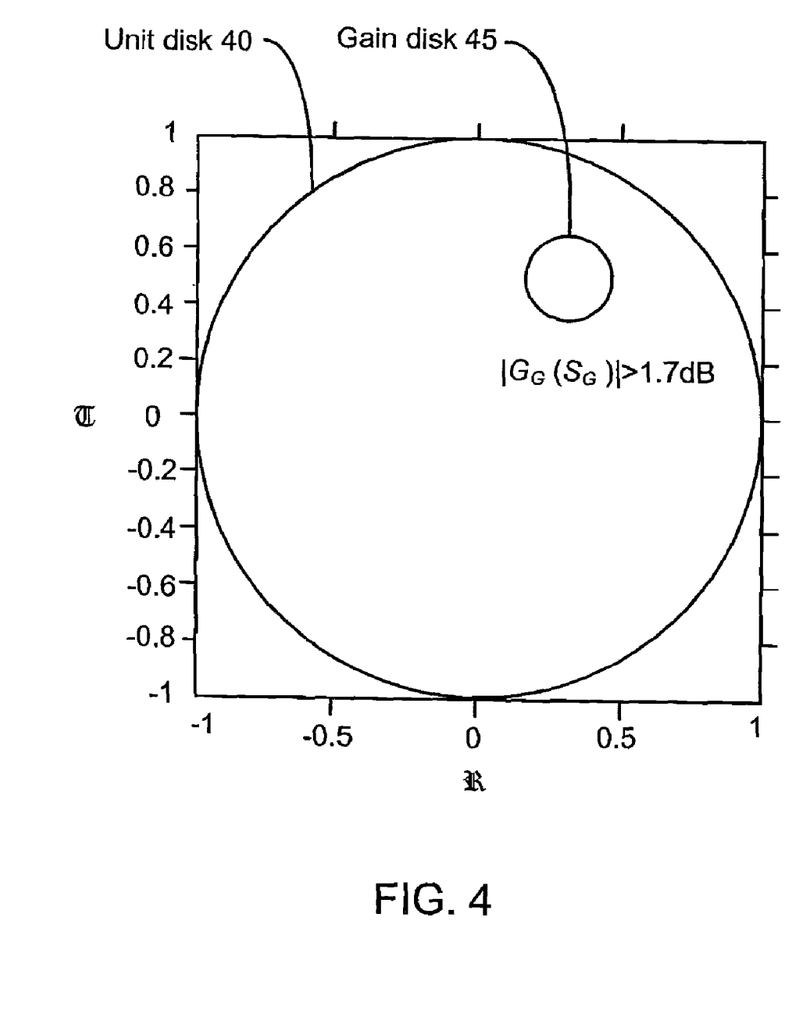
FIG. 4 is an illustration of a unit disk and a gain disk as output by one embodiment of the amplifier selection method and algorithm described herein.

The geometric approach of the amplifier selection method and algorithm as described herein will now be described in connection with FIGS. 2-7. As shown in FIG. 2, a disk is specified by a center $C_X$ and a radius $R_X$. Illustrated in FIG. 3 is the unit disk 40 that is generated by a collection of input and output reflectances $S_G$ and $S_L$ that satisfy gain, noise, and stability constraints input by the amplifier designer. If no reflectances can be found, the constraints are declared unfeasible. Otherwise, candidate centers $C_{X,G}$ and $C_{X,L}$ (shown in FIG. 2) are estimated by averaging over the input and output reflectances. The radii $R_{X,G}$ and $R_{X,L}$ (shown in FIG. 2) are slowly increased from zero to maximal values. For example, as shown in FIG. 4, the gain constraint of 1.7 dB determines the gain disk 45 ($G_G$), which can be expressed as: $G_G(S_G) > 1.7$ dB. It can be seen that increasing gain shrinks the gain disk 45.

Figure 5:
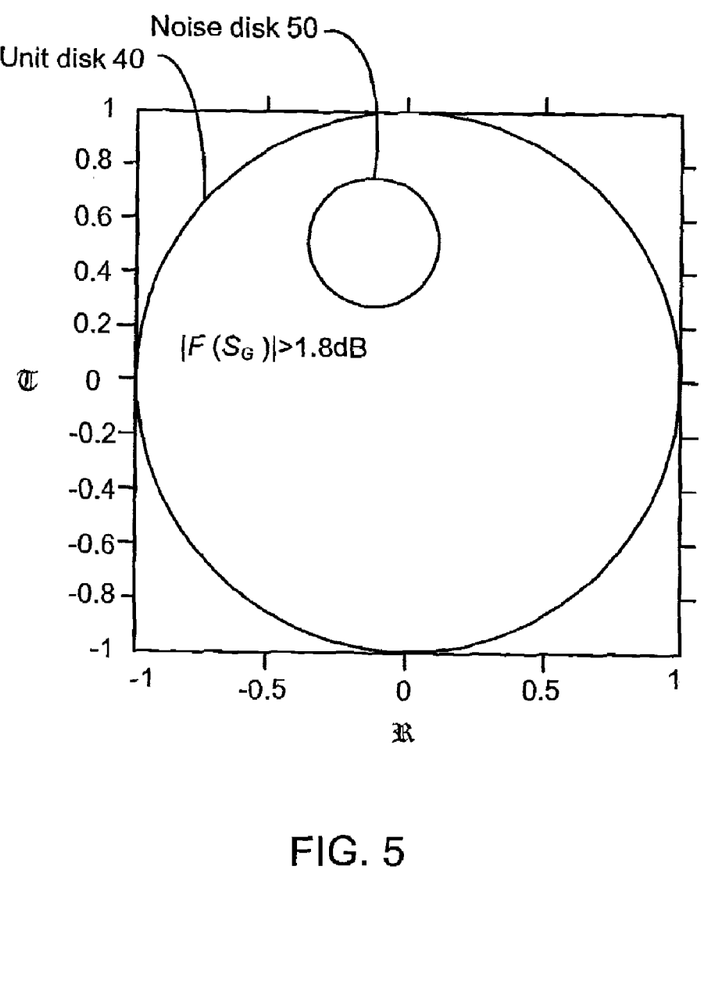
FIG. 5 is an illustration of a unit disk and a noise disk as output by one embodiment of the amplifier selection method and algorithm described herein.
Figure 6:
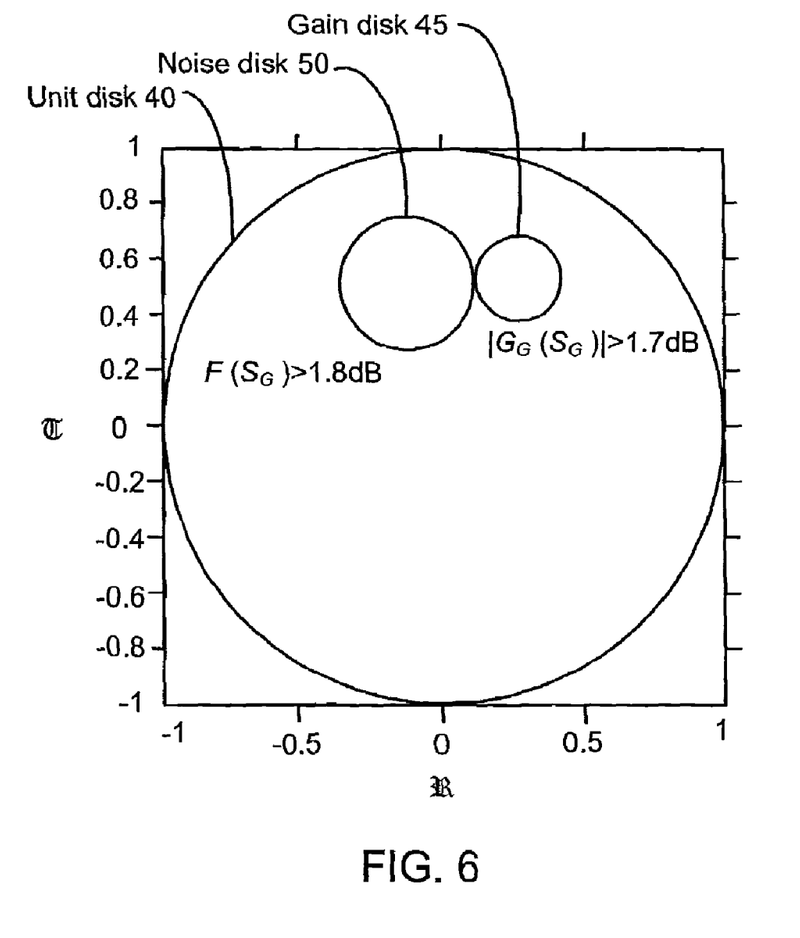
FIG. 6 is an illustration of a unit disk, noise disk and gain disk as output by one embodiment of the amplifier selection method and algorithm described herein.

Referring to FIG. 5, a noise constraint of 1.8 dB determines the noise disk 50 (F): $F(S_G) < 1.8$ dB. 1.8 dB was randomly chosen as an example, as was the 1.7 dB for the gain disk. It will be appreciated that these values can vary, depending upon the amplifier designer's inputs. Decreasing the noise figure shrinks the noise disk 50. As shown in FIG. 6, an intersection of the gain disk 45 and noise disk 50 mean that $S_G$ lies in both disks or $F(S_G) < 2$ dB and $G_G(S_G) > 1.7$ dB. Thus, the gain and noise constraints for the amplifier design are feasible.

Figure 7:
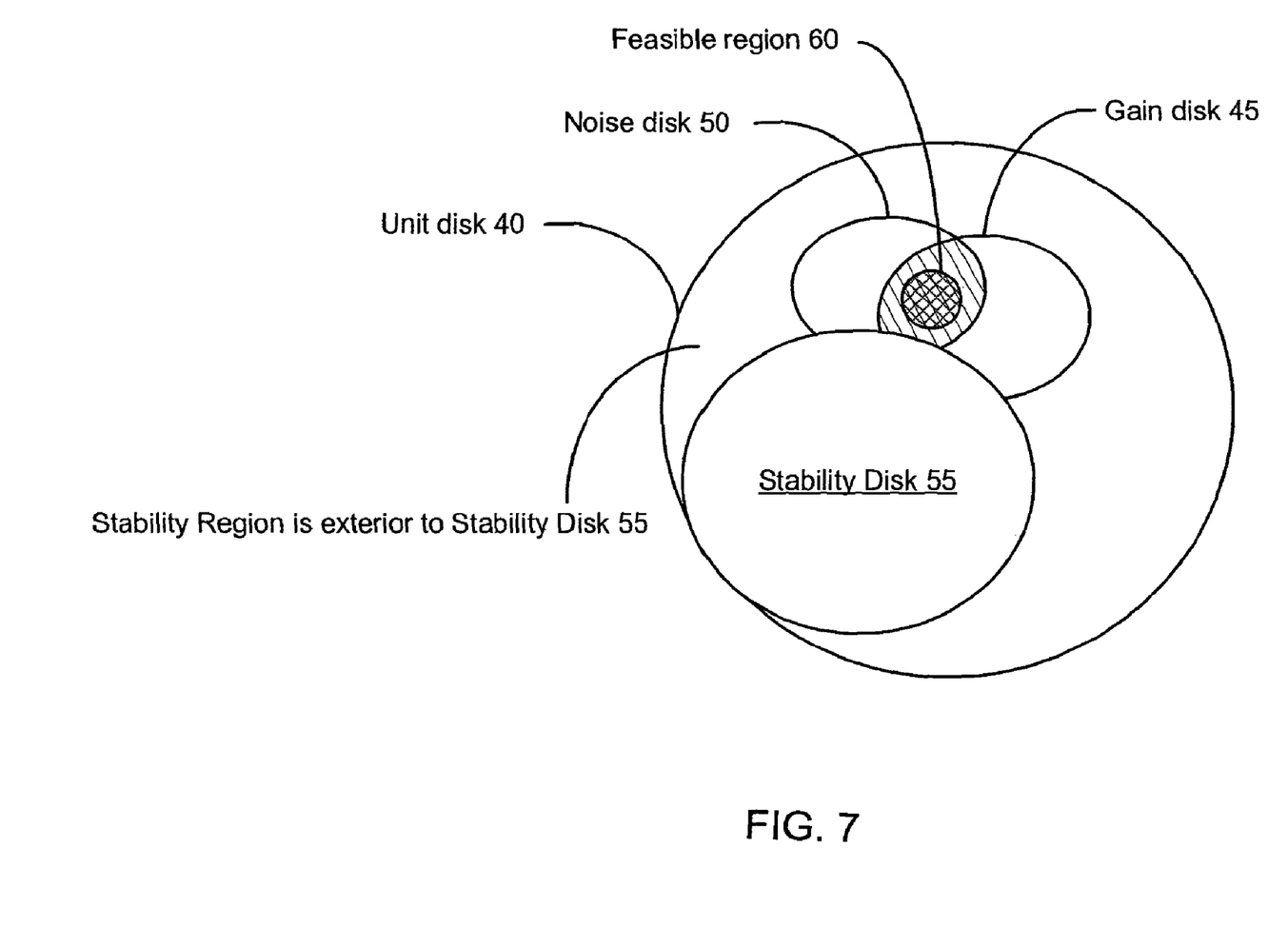
FIG. 7 is an illustration of a feasible region contained within a stability region and an intersection of a unit disk, a gain disk and a noise disk.

As shown in FIG. 7, an amplifier designer's constraints are geometrically feasible if the gain disk 45, noise disk 50, and stability disk 55 have an intersection at all sample frequencies. This intersection is the feasible region 60 that comprises a disk of circular cross section, showing that the design constraints of gain, noise and stability for the amplifier are feasible. The amplifier stability is illustrated in FIG. 7 as the region exterior to the stability disk 55.

Figure 8A:
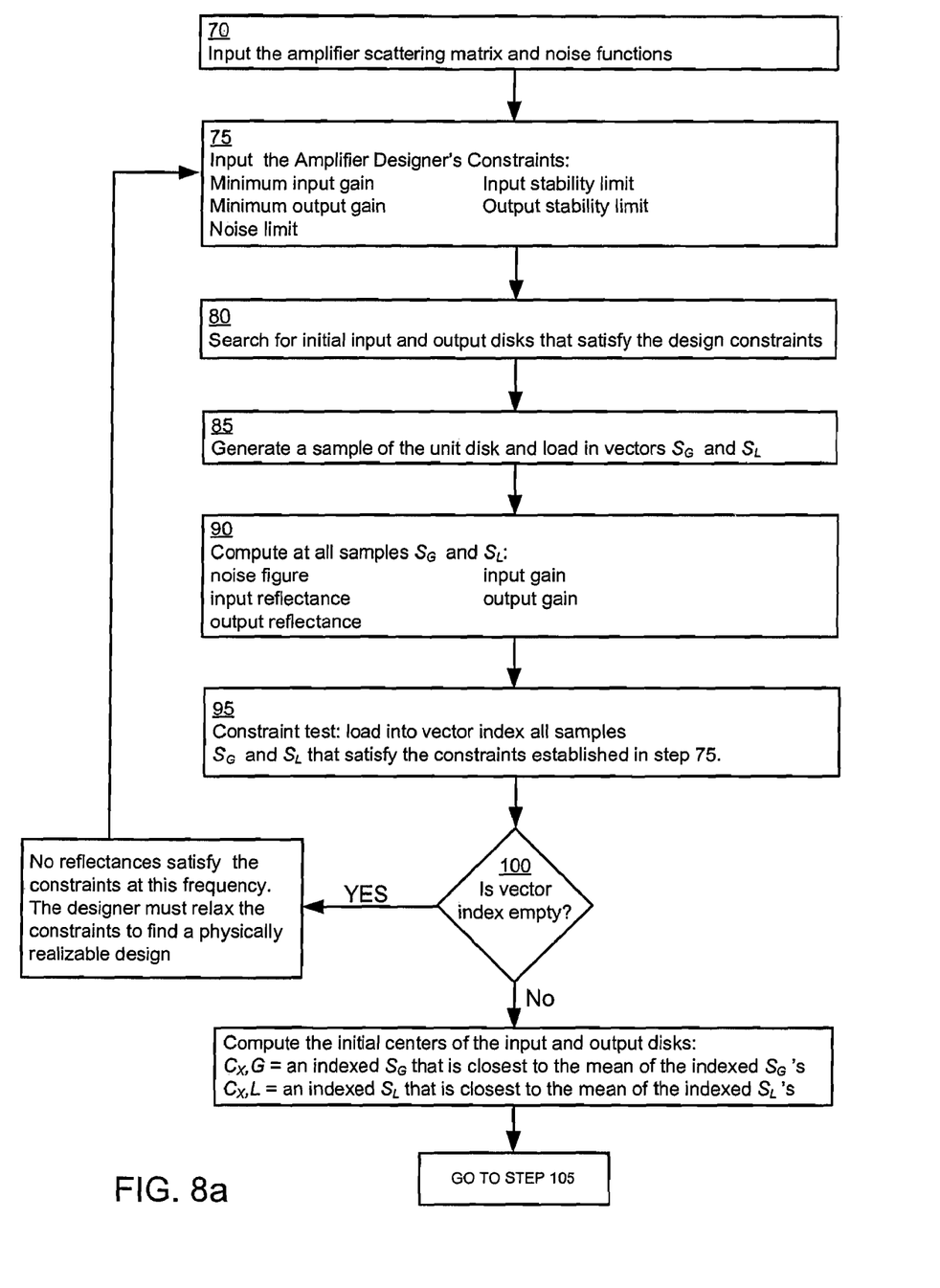
FIGS. 8a and 8b illustrate one method to practice the amplifier selection method and algorithm as described herein.
Figure 8B:
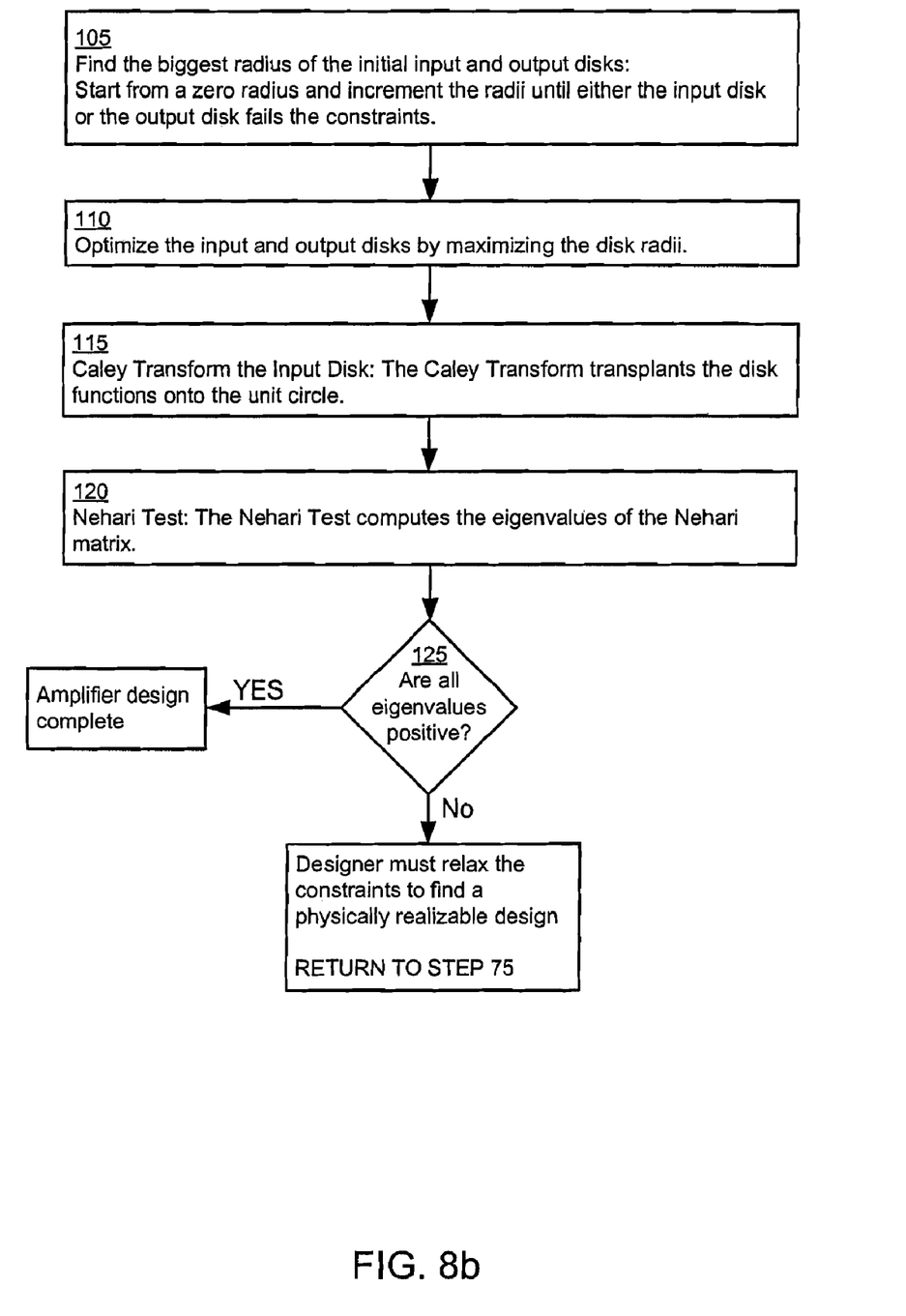

Referring now to FIGS. 8a and 8b, the analytic approach of the amplifier selection method is illustrated. In step 70 the amplifier scattering matrix and noise functions are input. In step 75, the amplifier designer's constraints are input. The designer's constraints may include: 1) the minimum input gain; 2) the minimum output gain; 3) the noise limit; 4) the input stability limit; and 5) the output stability limit.

In step 80, a search for the initial input and output disks that satisfy the design constraints is conducted. In step 85, a sample of the unit disk 40 and load in vectors $S_G$ and $S_L$ is generated. In step 90, the noise figure, input reflectance, output reflectance, input gain and output gain are computed for all samples of $S_G$ and $S_L$.

In step 95, a constraint test is performed by loading into a vector index all samples $S_G$ and $S_L$ that satisfy the following constraints 1-5:

$$F(S_G) < F_u \qquad 1)$$

where $F(S_G)$ is the noise figure, and $F_u$ is the user-specified noise figure.

$$|S_1(S_L)| < S_{1,u} \qquad 2)$$

where $S_1(S_L)$ is the input reflectance, and $S_{1,u}$ is the user-specified stability margin at Port 1.

$$|S_2(S_G)| < S_{2,u} \qquad 3)$$

where $S_2(S_G)$ is the output reflectance, and $S_{2,u}$ is the user-specified stability margin at Port 2.

$$G_G(S_G, S_L) > G_{G,u} \qquad 4)$$

where $G_G(S_G, S_L)$ is the input gain, and $G_{G,u}$ is the user-specified input gain.

$$G_L(S_L) > G_{L,u} \qquad 5)$$

where $G_L(S_L)$ is the output gain, and $G_{L,u}$ is user-specified output gain.

After the step 95 constraint test is performed the resulting vector index is examined in step 100. If the vector index is empty, no reflectances satisfy the amplifier designer's constraints at the chosen frequency. The designer must return to step 75 and relax the amplifier constraints to find a physically realizable design. If the vector index is not empty, the initial centers of the input and output disks are computed. The computation determines an indexed $S_G$ that is closest to the mean of all the indexed $S_G$'s. The computation also determines an indexed $S_L$ that is closest to the mean of all the indexed $S_L$'s.

In step 105, shown in FIG. 8b, the biggest radius of the initial input and output disks is determined by starting from a zero radius (radius $R_{X,G}=0$, and radius $R_{X,L}=0$). The radii are then incremented as follows:

$$R_{X,G} \leftarrow R_{X,G} + \Delta R_{X,G};$$

$$R_{X,L} \leftarrow R_{X,L} + \Delta R_{X,L}$$

until a call to "md01_constr" located in the MATLAB program 084539_cpl (in the computer program listing appendix) reports that either the input disk or the output disk fails the constraints. Also, these disks may be plotted at each frequency of interest. The plots may be displayed on a display device such as a computer monitor, TV screen or other appropriate device. At this point, the largest input and output disks have been calculated at each frequency of interest.

In step 110, the input and output disks are optimized by maximizing the disk radii using MATLAB's general-purpose optimizer fmincon. This optimizer accepts two functions as inputs: an objective function $h(x)$; and a constraint function $g(x)$ defined on the real vectors x of $R^M$. The MATLAB fmincon optimizer minimizes the objective function $h(x)$ subject to the constraint the vectors x are restricted to (i.e., $g(x) \leq 0$) and maximizes the radii of the input and output disk by maximizing the radii's square sum:

$$h(x) = R_{X,G}^2 + R_{X,L}^2$$

The input vector consists of the centers and radii of the input and output disks:

$$X = [C_{X,G} C_{X,L} R_{X,G} R_{X,L}].$$

The MATLAB optimizer fmincon searches over the centers and radii to find the "biggest" input and output disk subject to the design constraints (i.e., the "optimal" input and output disks). Thus, for each input reflectance $S_G$ in the input disk:

$$|S_G - C_{X,G}| \leq R_{X,G}$$

and each output reflectance $S_L$ in the output disk:

$$|S_L - C_{X,L}| \leq R_{X,L}$$

they satisfy the gain, noise and stability design constraints:

Gain: $G_G(S_G, S_L) \geq G_{G,u}$ and $G_L(S_L) \geq G_{L,u}$

Noise: $F(S_G) \leq F_u$

Stability: $|S_1(S_L)| \leq S_{1,u}$ and $|S_2(S_G)| \leq S_{2,u}$

Also, the optimal input and output disks may be plotted at each frequency of interest. The plots may be displayed on a display device such as a computer monitor, TV screen or other appropriate device. At this point, the optimal input and output disks have been calculated at each frequency of interest.

Now, in step 115, the center and radius functions are transplanted to the unit circle by using a Caley transform ("stcayley01" in the MATLAB program 084539_cpl, in the computer program listing appendix). The reason for the transplant is numerical—a Fast Fourier Transform (FFT) can efficiently compute Fourier coefficients from functions defined on the unit circle. The algebra of the transplant is:

$$c_{X,G}(z) = C_{X,G}(j\omega)$$

$$r_{X,G}(z) = R_{X,G}(j\omega)$$

where z is the complex number of unit magnitude that is linked to the frequency $j\omega$ by the Caley transform of the form:

$$z = (j\omega - \omega_{opt})(j\omega + \omega_{opt})^{-1}$$

where the upper case "C" and "R" denote the engineer's center and radius functions. The lower case "c" and "r" denote the transplanted functions for FFT processing. The subscripted G and L refer to the generator and load ports or, equivalently, input and output. The X refers to a CXS disk. Gathering all this notation, $c_{X,G}(z)$ denotes the center of the input CXS disk defined on the unit circle with radius $r_{X,G}(Z)$.

After the Cayley transform is performed, in step 120 a Nehari Test is performed. A Nehari Test determines if a given disk D(c, r) [where c is the center and r is the radius of the disk D] intersects the analytic functions. The test is an implementation of Nehari's Theorem that states the disk D(c, r) contains analytic functions if and only the matrix inequality holds:

$$T_r - H_c H_c^* \geq 0$$

where $T_r$ is the Toeplitz matrix as constructed from the FFT of the radius function;

where $H_c$ is the Hankel matrix as constructed from the FFT of the center function; and To test if $T_r - H_c H_c^*$ is positive, the eigenvalues $e = \text{eig}(T_r - H_c H_c^*)$ are calculated. If all the eigenvalues e are positive (e>0), the disk D(c,r) does contain an analytic function. If so, the designer knows an optimal amplifier can be designed that meets his or her constraints. If any eigenvalue e is negative, the disk D(c,r) does not contain an analytic function. If so, the designer returns to step 75 and changes the amplifier constraints.

The following discussion is intended to provide a brief, general description of a suitable computing environment in which the invention may be implemented. Although not required, the invention as described above is described in the general context of computer-executable instructions, such as program modules, being executed by a personal computer. Generally, program modules include routines, programs, objects, components, data structures, etc. that perform particular tasks or implement particular abstract data types. Moreover, those skilled in the art will appreciate that the invention may be practiced with other computer system configurations, including hand-held devices, multiprocessor systems, microprocessor-based or programmable consumer electronics, network PCs, minicomputers, mainframe computers, and the like. The invention may also be practiced in distributed computing environments where tasks are performed by remote processing devices that are linked through a communications network. In a distributed computing environment, program modules may be located on both local and remote memory storage devices.

As will be appreciated by one of skill in the art, embodiments as described above may be provided as methods, systems, or computer program products. Accordingly, embodiments of the amplifier selection algorithm may take the form of an embodiment combining software and hardware aspects. Furthermore, embodiments of the amplifier selection algorithm may take the form of a computer program product which is embodied on one or more computer-usable storage media (including, but not limited to, disk storage, CD-ROM, optical storage, flash memory storage, and so forth) having computer-usable program code embodied therein.

These computer program instructions may also be stored in a computer-readable memory that can direct a computer or other programmable data processing apparatus to function in a particular manner, such that the instructions stored in the computer-readable memory produce an article of manufacture including instruction means which implement the function specified in the flowcharts illustrated in FIGS. 8*a* and 8*b*.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions described above.

Thus, it is seen that a method and computer program for determining a best amplifier performance for all lumped, lossless input 2-port and lossless output 2-port amplifiers is provided.

What is claimed is:

1. A computer readable storage medium having a method for determining an amplifier performance encoded thereon, the method represented by computer executable instructions, the method comprising the steps of:

establishing a number of amplifier performance constraints;

conducting a search for an input and an output disk that satisfy the amplifier performance constraints;

generating a vector index comprising a load reflectance $S_L$ and a generator reflectance $S_G$ at a plurality of radio frequencies;

inputting the amplifier performance constraints into the vector index; and determining which load reflectances $S_L$ and generator reflectances $S_G$ meet the amplifier performance constraints.

2. The computer readable storage medium of claim 1, wherein the number of amplifier performance constraints are selected from a group consisting of: an input gain; an output gain; a noise limit; an input stability limit; and an output stability limit.

3. The computer readable storage medium of claim 1, further comprising the step of generating an input and an output disk using the load reflectances $S_L$ and generator reflectances $S_G$ that met the amplifier performance constraints.

4. The computer readable storage medium of claim 3, further comprising the step of determining a radius of the input and output disks that met the amplifier performance constraints.

5. The computer readable storage medium of claim 4, further comprising the step of optimizing the input and output disks by determining a maximum radius of each disk.

6. The computer readable storage medium of claim 3, further comprising the step of performing a Cayley Transform on the input disk.

7. The computer readable storage medium of claim 6, further comprising the step of generating eigenvalues of a Nehari matrix.

8. The computer readable storage medium of claim 7, further comprising the step of verifying the amplifier performance constraints are met if the eigenvalues are positive.

9. A computer program product for determining an amplifier performance, the computer program product embodied on one or more computer-usable storage media and comprising:
   a program module for allowing the input of a number of amplifier performance constraints;
   a program module for conducting a search for an input and an output disk that satisfy the amplifier performance constraints;
   a program module for generating a vector index comprising a load reflectance $S_L$ and a generator reflectance $S_G$ at a plurality of radio frequencies;
   a program module for inputting the amplifier performance constraints into the vector index; and
   a program module for determining which load reflectances $S_L$ and generator reflectances $S_G$ meet the amplifier performance constraints.

10. The computer program product of claim 9, wherein the number of amplifier performance constraints are selected from a group consisting of: an input gain; an output gain; a noise limit; an input stability limit; and an output stability limit.

11. The computer program product of claim 9, further comprising a program module for generating an input and an output disk using the load reflectances $S_L$ and generator reflectances $S_G$ that met the amplifier performance constraints.

12. The computer program product of claim 11, further comprising a program module for determining a radius of the input and output disks that met the amplifier performance constraints.

13. The computer program product of claim 12, further comprising a program module for optimizing the input and output disks by determining a maximum radius of each disk.

14. The computer program product of claim 11, further comprising a program module for performing a Cayley Transform on the input disk.

15. The computer program product of claim 14, further comprising a program module for generating eigenvalues of a Nehari matrix.

16. The computer program product of claim 15, further comprising a program module for verifying the amplifier performance constraints are met if the eigenvalues are positive.

* * * * *